United States Patent
Boguslawski et al.

(10) Patent No.: US 11,906,567 B2
(45) Date of Patent: Feb. 20, 2024

(54) METHOD FOR DETECTING AN ABNORMAL EVENT IN AN ELECTRICAL CONDUCTOR OF A MEDIUM VOLTAGE ELECTRICAL DEVICE

(71) Applicant: Schneider Electric Industries SAS, Rueil Malmaison (FR)

(72) Inventors: Bartosz Boguslawski, Grenoble (FR); Diego Alberto, Corenc (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 17/965,832

(22) Filed: Oct. 14, 2022

(65) Prior Publication Data
US 2023/0129833 A1  Apr. 27, 2023

(30) Foreign Application Priority Data
Oct. 25, 2021 (FR) .................... 2111325

(51) Int. Cl.
  *H01H 31/12* (2006.01)
  *G01R 31/12* (2020.01)
(52) U.S. Cl.
  CPC ..... *G01R 31/1209* (2013.01); *G01R 31/1272* (2013.01)
(58) Field of Classification Search
  CPC ............ G01R 31/1209; G01R 31/1218; G01R 31/1227; G01R 31/1272; G01R 31/1245; G01R 31/1254; G01R 31/1263; G01R 31/081; G01R 31/083; G01R 31/52; G01R 31/58; G01R 31/62
  See application file for complete search history.

(56) References Cited

U.S. PATENT DOCUMENTS 6,076,411 A * 6/2000 Horvath ................. G01N 21/88
                                                    73/866
6,114,871 A * 9/2000 Shiota ................... G01R 31/343
                                                    324/765.01

(Continued)

FOREIGN PATENT DOCUMENTS

FR      3086059 A1   3/2020
WO   2020160590 A1   8/2020

OTHER PUBLICATIONS

French Search Report and Written Opinion dated Jul. 6, 2022 for corresponding French Patent Application No. FR2111325, 9 pages.

*Primary Examiner* — Thang X Le
(74) *Attorney, Agent, or Firm* — Locke Lord LLP

(57) ABSTRACT

A method for detecting an abnormal event in an insulator of an electrical conductor of a medium-voltage or high-voltage electrical device. The method includes: acquiring a set of successive samples of a vibration signal associated with the electrical conductor; determining a modelled value of a following sample based on the acquired set of samples and on a prediction model, the prediction model being obtained through machine learning of the vibration signal based on a set of samples acquired in reference conditions in which the electrical conductor is free from any abnormal event; acquiring the following sample of the vibration signal; calculating a difference between the value of the acquired sample and the modelled value; and if the calculated difference is greater than a predetermined threshold, detecting an abnormal event in the electrical conductor.

11 Claims, 3 Drawing Sheets

(56) References Cited

U.S. PATENT DOCUMENTS

| | | | |
|---|---|---|---|
| 6,300,768 B1* | 10/2001 | Kato | G01R 31/1254 |
| | | | 324/536 |
| 2018/0045768 A1* | 2/2018 | Godfrey | G01R 31/1209 |
| 2021/0123966 A1* | 4/2021 | Karin | G01R 31/62 |
| 2021/0190839 A1* | 6/2021 | Lim | G01R 23/165 |
| 2021/0190850 A1* | 6/2021 | Gundel | G01R 31/1272 |
| 2022/0011154 A1 | 1/2022 | De Grimaudet De Rochebouet | |

\* cited by examiner

METHOD FOR DETECTING AN ABNORMAL EVENT IN AN ELECTRICAL CONDUCTOR OF A MEDIUM VOLTAGE ELECTRICAL DEVICE

TECHNICAL FIELD

The present invention relates to the field of medium-voltage or high-voltage electrical devices.

PRIOR ART

Electrical devices operating at medium voltage or high voltage may be subject to abnormal events during operation thereof. One example of an abnormal event is for example one or more partial discharges between electrical conductors and the surrounding environment. A partial discharge is understood to mean an electrical discharge located in electrical insulation. The discharge is said to be partial because it does not short-circuit all of the insulation. These partial discharges may propagate in air, or within the insulating material itself. These partial discharges do not affect the operation of the electrical device in question in the short term, but speed up the ageing of the insulators. When the insulators are excessively damaged, an outright electric arc may arise, this possibly leading to the destruction of the electrical device and exhibiting major risks for people located near the device. Partial discharges thus have to be detected in order to allow intervention before permanent damage, destruction of the electrical device in question, and before an incident involving people.

Various partial discharge detection methods are known. One of these consists in monitoring partial discharges locally, and is based on measuring vibrations at the surface of an insulator around an electrical conductor of the electrical device. For this purpose, a vibration measurement sensor is arranged on the insulator of an electrical conductor of the electrical device. A signal processing method based on statistical processing of the measurements taken makes it possible to determine events corresponding to a partial discharge.

However, such a method has limitations. In particular, its accuracy is generally limited due to the significant amplitude of surrounding noise with respect to that of the partial discharge when said partial discharge is of relatively low amplitude. The false detection rate and the non-detection rate are thus relatively high.

There is therefore a need to have a method for detecting an abnormal event such as a partial discharge that provides improved accuracy, with in particular a non-detection rate and a false detection rate that are both reduced.

SUMMARY

To this end, the invention proposes a method for detecting an abnormal event in an insulator of an electrical conductor of a medium-voltage or high-voltage electrical device, the method comprising the following steps:
  acquiring a set of successive samples of a vibration signal associated with the electrical conductor,
  determining a modelled value of a following sample based on the acquired set of samples and on a prediction model,
the prediction model being obtained through machine learning of the vibration signal based on a set of samples acquired in reference conditions in which the electrical conductor is free from any abnormal event,
  acquiring the following sample of the vibration signal,
  calculating a difference between the value of the acquired sample and the modelled value,
  if the calculated difference is greater than a predetermined threshold, detecting an abnormal event in the electrical conductor.

The detection of an abnormal event in the electrical conductor is based both on an actually measured measurement of a vibration signal associated with the electrical conductor and on a model that calculates the expected evolution of the vibration signal. An excessively large difference between the modelled signal and the actually measured signal indicates that the abnormal event to be detected has occurred. Since the prediction model is obtained through machine learning, it may thus be adapted automatically to the actual characteristics of each item of electrical equipment for which the method is implemented. The dispersions between items of equipment are thus taken into consideration automatically, thereby making the method easier to develop and more effective.

The machine learning is performed based on a set of samples acquired in reference conditions in which the electrical conductor is free from any abnormal event. The machine learning is thus performed based on a set of samples in which the abnormal event to be detected is absent. The set of possible values of the vibration signal in the absence of the abnormal event to be detected may thus be characterized, and corresponds to the nominal noise of the vibration signal in the absence of any abnormal event. The machine learning of the nominal noise of the vibration signal during the phase of life of the device in which there is no partial discharge makes it possible to improve the performance of the detection method, both in terms of the non-detection rate and in terms of the false detection rate of the unwanted abnormal event.

This method makes it possible to improve the accuracy of the detection in comparison with conventional methods based only on processing the measured signal.

The features listed in the following paragraphs may be implemented independently of one another or in any technically possible combination:

According to one aspect of the method, the method comprises the following step:
  if the calculated difference is less than or equal to the predetermined threshold, detecting the absence of any abnormal event in the electrical conductor.

According to one embodiment, the detected abnormal event is a partial discharge.

As a variant or in addition, the abnormal event may be a mechanical impact affecting the operation of the device. For example, the abnormal event may be an unintentional start-up of an electric motor or mechanical impacts caused by this motor.

A partial discharge does not lead to failure of the electrical device in the short term, but it is desirable to detect the occurrence of such an event in order to avoid long-term failure.

According to one embodiment, the vibration signal is a vibrating signal representative of a vibration of the insulator of the electrical conductor.

According to another embodiment, the vibration signal is an acoustic signal carried in the insulator of the electrical conductor.

According to one embodiment, the successive samples of the vibration signal are acquired at a fixed sampling frequency.

As a variant, the successive samples of the vibration signal may be acquired at a variable sampling frequency.

According to one embodiment, the sampling frequency is between 1 kHz and 1000 kHz.

The method may comprise the following step:

checking that the set of samples used for the machine learning is compliant with operation free from any abnormal event.

The machine learning process is thus not disrupted by samples that are not compliant.

According to another aspect of the invention, the reference conditions in which the machine learning is performed are an operating period starting when the electrical device is first commissioned and of a duration equal to a predetermined first duration of use of the electrical device.

According to one embodiment, the predetermined first duration of use is between 10 hours and 20 hours.

According to one embodiment, the reference conditions in which the machine learning is performed are an operating period starting when the electrical conductor is first commissioned and of a duration equal to a predetermined second duration of use of the electrical device.

According to one aspect of the invention, the machine learning is reset in the event of the electrical conductor being replaced.

The parameters of the machine learning are stored in a permanent memory of the electronic control unit.

The acquisition duration of the set of samples acquired in reference conditions is greater than 5 seconds, for example greater than 20 seconds.

This acquisition duration makes it possible to obtain a sufficiently accurate model with a reasonable learning duration.

According to one exemplary implementation of the method, the set of successive samples of the vibration signal taken into consideration to determine a modelled value of the following sample comprises a fixed number of samples, the fixed number of samples being between 10 and 20.

For example, the modelled value of the following sample is obtained based on the 15 previously acquired samples.

According to one embodiment, the set of successive samples of the vibration signal taken into consideration to determine a modelled value of the following sample may comprise a variable number of samples of between 4 and 20.

According to one embodiment, the method comprises the following step:

if an abnormal event is detected in the insulator of the electrical conductor, incrementing an abnormal event counter.

The abnormal event counter may thus be a partial discharge counter.

According to one embodiment, the method comprises the following step:

if an abnormal event is detected in the insulator of the electrical conductor, calculating a frequency of occurrence of the abnormal event, the frequency of occurrence of the abnormal event being equal to the ratio of the value of the abnormal event counter and the number of acquired samples.

The frequency of occurrence of the abnormal event may thus be a partial discharge frequency. In other words, the frequency of occurrence of the abnormal event is in this case a rate of occurrence of a partial discharge in the electrical conductor.

According to one aspect of the method, the method comprises the following step:

if the frequency of occurrence of the abnormal event reaches a predetermined second threshold, emitting an alert signal.

According to one variant implementation, the method comprises the following step:

if the abnormal event counter reaches a predetermined third threshold, emitting an alert signal.

According to one embodiment, the predetermined third threshold Nmax for the number of acceptable abnormal events is equal to 1.

In other words, in this case, no abnormal event is tolerated and users of the device are warned when an abnormal event occurs for the first time.

According to one embodiment, the predetermined third threshold Nmax for the number of acceptable abnormal events is between 2 and 5.

According to one exemplary implementation, the alert signal is a fault code that is stored in an electronic control unit.

According to one variant or in addition, the alert signal is the activation of an indicator light.

According to another variant or in addition, the alert signal is an acoustic signal.

According to one embodiment, if the abnormal event counter reaches the predetermined third threshold or if the frequency of occurrence of the abnormal event reaches the predetermined second threshold, a method for classifying the abnormal event is initiated.

The invention also relates to a medium-voltage or high-voltage electrical device, the electrical device comprising:

an electrical conductor, a sensor configured to supply a vibration signal associated with an insulator of the electrical conductor, an electronic control unit configured to implement the detection method as described above.

According to one embodiment, the sensor is configured to supply a signal representative of an acceleration of the insulator of the electrical conductor.

The acceleration sensor is fixed to an outer surface of the electrical conductor.

The acceleration sensor is a piezoelectric sensor.

According to one embodiment, the bandwidth of the vibration sensor is between 1 kHz and 1000 kHz.

According to one exemplary implementation of the method, the acceleration sensor delivers an analogue signal.

As a variant, the acceleration sensor delivers a digital signal.

BRIEF DESCRIPTION OF THE DRAWINGS

Other features, details and advantages will become apparent from reading the description provided below and from examining the appended drawings, in which.

DESCRIPTION OF THE EMBODIMENTS

For the sake of the legibility of the figures, the various elements have not necessarily been shown to scale. In these figures, elements that are identical have been designated with the same references. Certain elements or parameters may be indexed, that is to say designated for example by first element or second element, or even first parameter and second parameter, etc. The aim of this indexing is to differentiate between elements or parameters that are similar but not identical. This indexing does not imply that one element or parameter takes priority over another, and the denominations may be interchanged. When it is specified that a device comprises a given element, this does not exclude the presence of other elements in this device.

Figure 1:
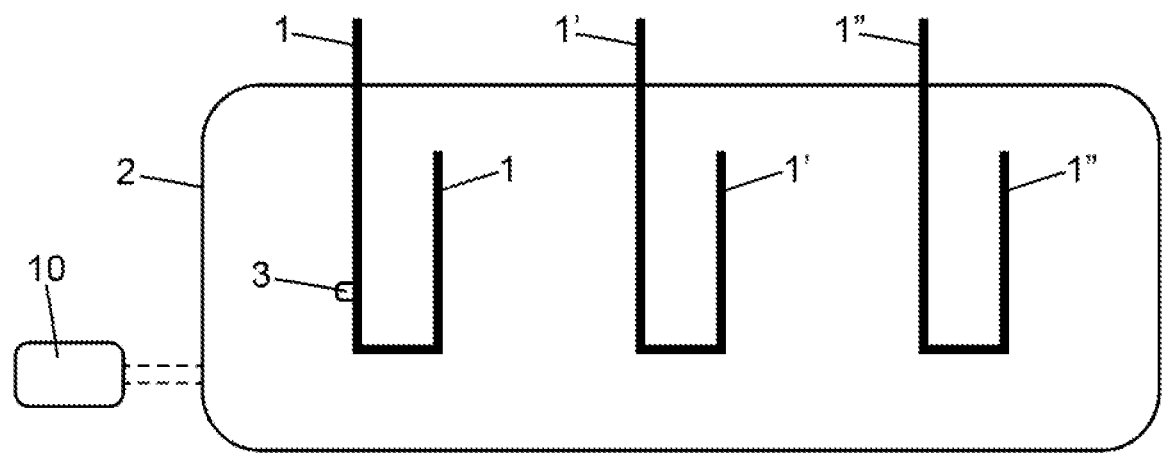
FIG. 1 is a schematic depiction of an electrical device on which the method according to the invention is implemented.

FIG. 1 shows a medium-voltage or high-voltage electrical device 2, the electrical device 2 comprising:
- an electrical conductor 1,
- a sensor 3 configured to supply a vibration signal V associated with an insulator 5 of the electrical conductor 1,
- an electronic control unit 10 configured to implement a detection method according to the invention.

The electrical device 2 is an item of medium-voltage equipment, that is to say with a voltage of between 1 kV and 52 kV. The electrical device 2 may also be an item of high-voltage equipment. The electrical device 2 may for example be a circuit breaker, a disconnector or a switch.

The electrical device 2 comprises a plurality of electrical conductors. For example, the electrical device 2 comprises three electrical conductors 1, 1', 1" corresponding to the three phases of a three-phase electrical network. The method according to the invention is applied to each of the electrical conductors 1, 1', 1".

The method according to the invention is a method for detecting an abnormal event in an insulator 5 of an electrical conductor 1 of a medium-voltage or high-voltage electrical device 2. The method comprises the following steps:
- acquiring a set $S_n$ of successive samples $E_1, \ldots, E_n$ of a vibration signal V associated with the electrical conductor 1, (step 50)
- determining a modelled value $M_{n+1}$ of a following sample $E_{n+1}$ based on the acquired set $S_n$ of samples and on a prediction model, (step 51)

the prediction model being obtained through machine learning of the vibration signal V based on a set $V_p$ of samples acquired in reference conditions CRef in which the electrical conductor 1 is free from any abnormal event,
- acquiring the following sample $E_{n+1}$ of the vibration signal V, (step 52)
- calculating a difference $D_{n+1}$ between the value of the acquired sample $E_{n+1}$ and the modelled value $M_{n+1}$, (step 53)
- if the calculated difference $D_{n+1}$ is greater than a predetermined threshold Th, detecting an abnormal event in the electrical conductor 1. (step 54)

The detection of an abnormal event in the electrical conductor is based both on an actually measured value of a vibration signal associated with the electrical conductor and on a model that calculates the expected evolution of this vibration signal. An excessively large difference between the modelled signal and the actually measured signal indicates that the abnormal event to be detected has occurred. Since the prediction model is obtained through machine learning, it may thus be adapted automatically to the actual characteristics of each item of electrical equipment for which the method is implemented. The dispersions between items of equipment are thus taken into consideration automatically, thereby making the method easier to develop and more effective.

The machine learning is performed based on a set $V_p$ of samples acquired in reference conditions CRef in which the electrical conductor 1 is free from any abnormal event. The machine learning is thus performed based on a set $V_p$ of samples in which the abnormal event to be detected is absent. The set of possible values of the vibration signal in the absence of the abnormal event to be detected may thus be characterized, and corresponds to the nominal noise of the vibration signal in the absence of any abnormal event. The machine learning of the nominal noise of the vibration signal during the phase of life of the device in which there is no partial discharge makes it possible to improve the performance of the detection method, both in terms of the non-detection rate and in terms of the false detection rate of the unwanted abnormal event. This method makes it possible to improve the accuracy of the detection in comparison with conventional methods based only on processing the measured signal.

According to one aspect of the method, the method comprises the following step:
- if the calculated difference Dn+1 is less than or equal to the predetermined threshold Th, detecting the absence of any abnormal event in the electrical conductor 1.

In other words, a small difference between the modelled signal and the actually measured signal indicates that no abnormal event has occurred. In this case, the detection of the absence of any abnormal event is confirmation that the abnormal event is absent, that is to say that it has not occurred.

Figure 3:
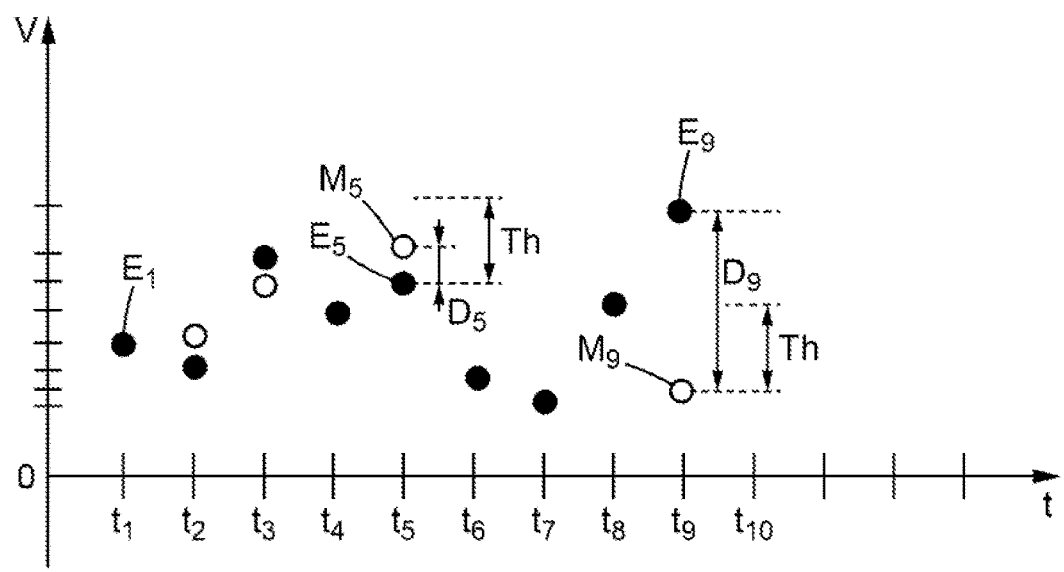
FIG. 3 is a schematic depiction of the temporal evolution of parameters of the method according to the invention.

FIG. 3 outlines the operation of the method. The successive measured samples $E_1, \ldots, E_n$ of the vibration signal correspond, respectively, to successive measurement times $t_1, \ldots, t_n$. Thus, 10 measurement times $t_1, \ldots, t_{10}$ have been shown in FIG. 3. When a set $S_n$ of successive samples $E_1, \ldots, E_n$ has been acquired and the sample $E_n$ is the most recent sample, the following sample $E_{n+1}$ corresponds to the output value delivered by the vibration sensor 3 at the time $t_{n+1}$.

The point $E_1$ represents the value of the signal V measured at the time $t_1$. The point $E_5$ represents the value of the signal V measured at the time $t_5$, and the point $E_9$ represents the value of the signal V measured at the time $t_9$. The point $M_5$ represents the modelled value of the sample $E_5$, and likewise the point $M_9$ represents the modelled value of the sample $E_9$. To simplify the figure, the points $M_1$ to $M_4$ and $M_6$ to $M_8$ have not been shown. The difference $D_9$ between the acquired sample $E_9$ and the modelled value $M_9$ is greater than the threshold Th. This therefore indicates that an abnormal event has occurred between the time $t_8$ and the time $t_9$. The difference $D_5$ between the acquired sample $E_5$ and the modelled value $M_5$ is less than the threshold Th. No abnormal event has occurred between the time $t_4$ and the time $t_5$. Only positive values have been shown in FIG. 3 for simplification, but the signal may also take negative values.

According to the example illustrated here, the detected abnormal event is a partial discharge. A partial discharge does not lead to failure of the electrical device in the short term, but it is desirable to detect the occurrence of such an event in order to avoid long-term failure of the electrical device 2. When a partial discharge is detected, the partial discharge took place between the time $t_n$ and the time $t_{n+1}$.

According to another exemplary embodiment, the abnormal event may be a mechanical impact affecting the operation of the device. For example, the abnormal event may be an unintentional start-up of an electric motor, or else a mechanical impact caused by this motor. This exemplary use of the method will not be described here.

The vibration signal V here is a vibrating signal representative of a vibration of the insulator 5 of the electrical conductor 1. The insulator 5 surrounds the electrical conductor 1 and forms an insulating sheath around it. The vibration signal is also called output signal from a vibration sensor 3.

According to the illustrated embodiment, the sensor 3 is configured to supply a signal V representative of an acceleration of the insulator 5 of the electrical conductor 1. In other words, the sensor 3 is an acceleration sensor.

Figure 2:
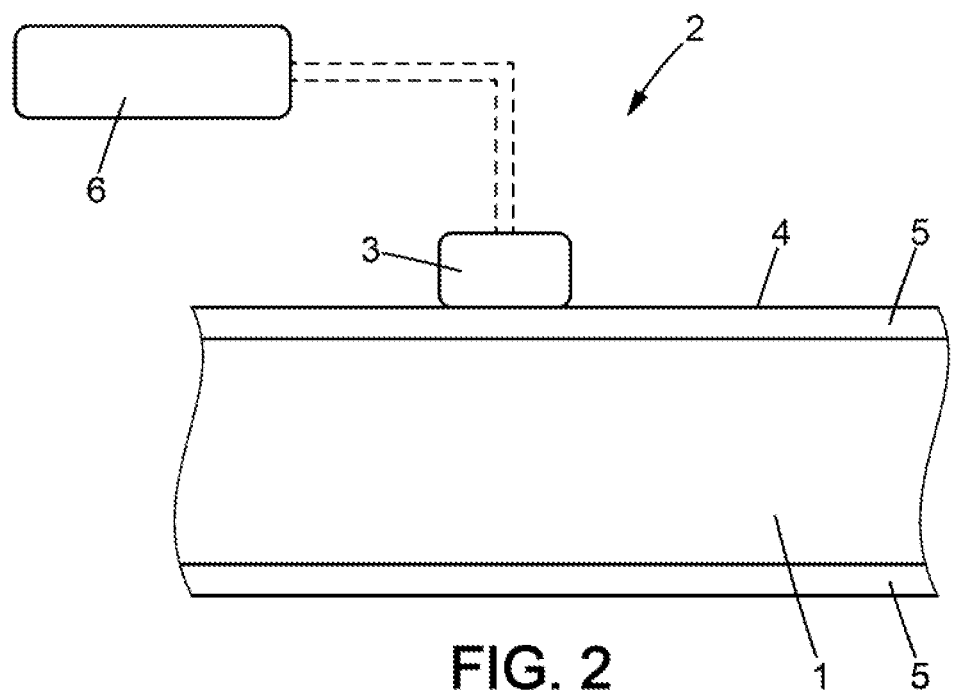
FIG. 2 is a schematic detailed depiction of the electrical device from FIG. 1.

As outlined in FIG. 2, the acceleration sensor 3 is fixed to an outer surface 4 of the electrical conductor 1. More specifically, the electrical conductor 1 is surrounded by an insulator 5 forming a sheath, and the acceleration sensor 3 is fixed to the outer surface of the insulator 5.

The acceleration sensor 3 is linked rigidly to the outer surface 4 of the electrical conductor 1. In other words, the sensor 3 is linked rigidly to the insulator 5. The acceleration sensor 3 thus measures the vibrations propagating at the surface of the electrical conductor close to the sensor.

The acceleration sensor 3 is for example a piezoelectric sensor. In other words, the sensor 3 comprises a piezoelectric element, not shown, and the mechanical vibrations of the electrical conductor 1 modify the pressure exerted on the piezo element. A voltage thus occurs across the terminals of the piezo element. This voltage across the terminals of the piezoelectric element is amplified so as to supply a usable output signal. An electronic processing module 6 makes it possible to process the signal from the sensor 3. This signal processing module 6 may be separate from the electronic control unit 10. According to another exemplary implementation, the signal processing module 6 may form part of the electronic control unit 10.

The bandwidth of the vibration sensor 3 is between 1 kHz and 1000 kHz. According to the illustrated example, the acceleration sensor 3 delivers an analogue signal. According to another exemplary implementation of the method, the acceleration sensor 3 delivers a digital signal.

A measured sample $E_n$ of the vibration signal may correspond for example to a value, sampled at a given time $t_n$, of a vibration sensor. In other words, a measured sample $E_n$ then corresponds to an instantaneous value of the signal from the vibration sensor.

As a variant, a measured sample $E_n$ of the vibration signal may correspond for example to the integral of the instantaneous signal from a vibration sensor for a predetermined duration. In other words, a measured sample $E_n$ then corresponds to an averaged value of the signal from the vibration sensor. The predetermined duration for which the instantaneous signal is integrated is less than, or possibly equal to, the sampling period.

According to one embodiment, the successive samples $E_1, \ldots, E_n$ of the vibration signal are acquired at a fixed sampling frequency.

As a variant, the successive samples $E_1, \ldots, E_n$ of the vibration signal may be acquired at a variable sampling frequency. This scenario has not been shown.

According to one embodiment, the sampling frequency is between 1 kHz and 1000 kHz.

According to another embodiment, the vibration signal is an acoustic signal carried in the insulator 5 of the electrical conductor 1. The vibrations transmitted for example by an electric motor supplied with power by the electrical device may thus be analysed.

The machine learning is performed based on sampled values of the vibration signal.

Figure 4:
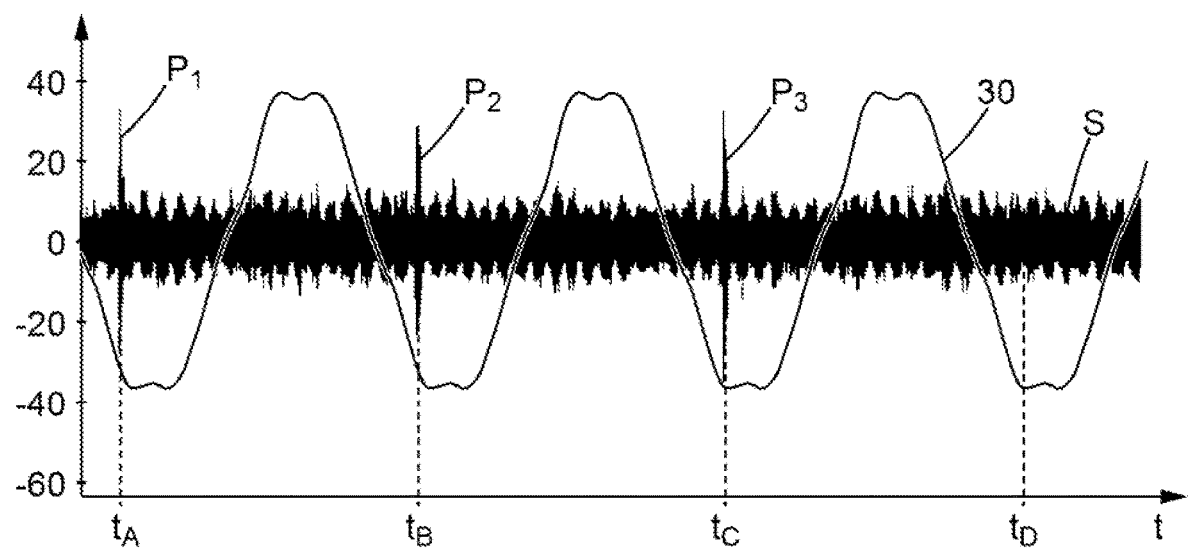
FIG. 4 is another depiction of the temporal evolution of parameters of the method according to the invention.

FIG. 4 illustrates the vibration signal over a duration of around 70 milliseconds. The set of measured points S appears as a band since the spaces between the discrete points are no longer visible at this scale. The curve 30 illustrates the voltage, which varies substantially sinusoidally. The peaks $P_1$, $P_2$, $P_3$ occurring respectively at the times $t_A$, $t_B$, $t_C$ correspond to partial discharges. The signal at the time to corresponds to the absence of any partial discharge. The set of modelled values has not been shown on this curve, and only the raw signal from the vibration sensor 3 is shown.

The method may comprise the following step:
 checking that the set $V_p$ of samples used for the machine learning is compliant with operation free from any abnormal event.

This optional step makes it possible to check that the machine learning process is not disrupted by samples that are not compliant. In other words, this step makes it possible to check that the reference that is used is correct.

During the acquisition of the samples forming the set $V_p$ used to perform the machine learning, a second abnormal event detection method is thus implemented simultaneously. This second method is based on a principle other than the one used by the method according to the invention, and is used as a comparison reference. The instruments needed to implement this second method may be installed only for the step of checking the compliance of the set $V_p$ of samples used for the machine learning. For example, a method based on using an electrical signal via capacitive coupling may be implemented to perform this comparison with the vibration signal.

According to another aspect of the invention, the reference conditions CRef in which the machine learning is performed are an operating period starting when the electrical device 2 is first commissioned and of a duration equal to a predetermined first duration of use D1 of the electrical device 2.

In other words, the machine learning is performed after the device is first commissioned and for a predetermined first duration of use D1. According to one embodiment, the predetermined first duration of use D1 is between 10 hours and 20 hours.

In other words, the predetermined first duration of use D1 for which the machine learning of noise is performed corresponds to the operation of the electrical device 2 in the new state. During this period, the operation of the electrical device 2 is free from any partial discharge. In other words, during this period, no unwanted abnormal event occurs, and the signal delivered by the sensor 3 corresponds to residual measurement noise. Since the worsening of the dielectric properties of the electrical device 2 is a slow phenomenon, the new state of the electrical device may actually last for several tens of hours. The machine learning may thus be performed at any time between the time when the device is first used and the end of the predetermined first duration of use D1.

According to one embodiment, the reference conditions CRef in which the machine learning is performed are an operating period starting when the electrical conductor 1 is first commissioned and of a duration equal to a predetermined second duration of use D2 of the electrical device 2.

According to one aspect of the invention, the machine learning is reset in the event of the electrical conductor being replaced.

In the event of the electrical conductor 1 being replaced, for example in a maintenance operation following detection of a fault, the machine learning is performed again after the electrical conductor 1 has been replaced and for a predetermined second duration of use D2.

In other words, in the event of the electrical conductor 1 being replaced, for example in the event of maintenance of the electrical device 2, the predetermined second duration D2 for which the machine learning of noise will be performed corresponds to the new state of the electrical conductor 1 that has just been replaced. Since the worsening of the dielectric properties of the electrical conductor 1 is a slow phenomenon, it is considered that the new state of the electrical conductor lasts for several tens of hours.

Figure 5:
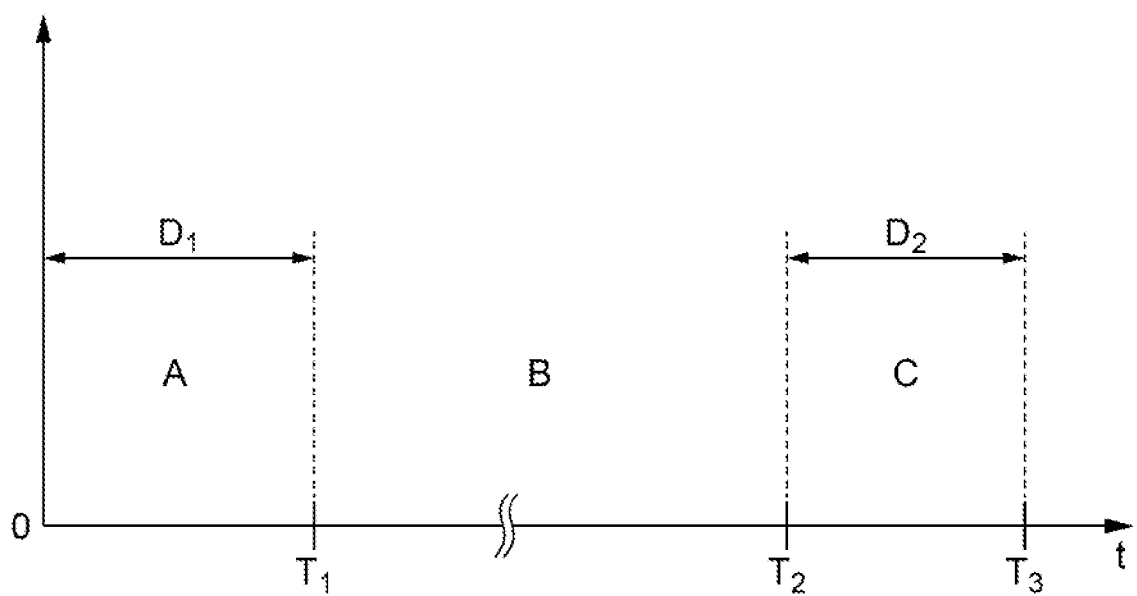
FIG. 5 is a timing diagram illustrating one particular step of the method according to the invention.
Figure 6:
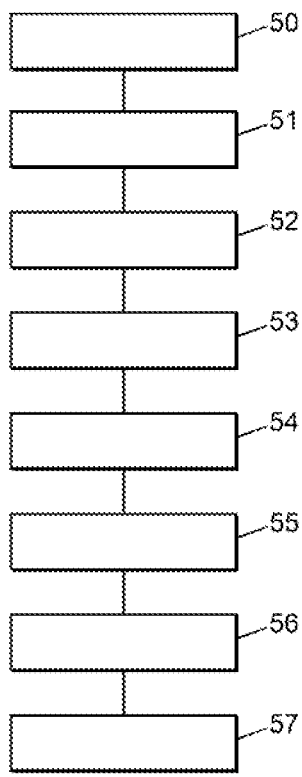
FIG. 6 is a block diagram illustrating various steps of the method according to the invention.

FIG. 5 summarizes the conditions in which the machine learning may be performed. The time 0 corresponds to the electrical device 2 first being commissioned. The time $T_2$ corresponds to the device being recommissioned after replacement of an electrical conductor 1. The area designated A is an area in which the machine learning may be performed, since the operating duration of the device is then less than the predetermined duration $D_1$. In the area designated B, the machine learning is no longer able to be performed as the operating duration is then greater than $D_1$. In the area designated C, the machine learning is able to be performed again, since the operating duration since the replacement of the electrical conductor 1 is less than the second duration $D_2$. The two curved lines on the horizontal time axis indicate that the time interval between $T_1$ and $T_2$ is not depicted on the same scale as the durations $D_1$ and $D_2$.

The parameters of the machine learning are stored in a permanent memory of the electronic control unit 10.

The acquisition duration of the set $V_p$ of samples acquired in reference conditions CRef is greater than 5 seconds, for example greater than 20 seconds. This acquisition duration makes it possible to obtain a sufficiently accurate model with a reasonable learning duration.

The number of samples acquired to perform the machine learning is thus variable, since it depends on the sampling frequency and on the acquisition duration. An acquisition duration of 20 seconds, combined with a sampling frequency of 1000 kHz, makes it possible to have 20 million points for performing the machine learning.

According to one exemplary implementation of the method, the set Sn of successive samples $E_1, \ldots, E_n$ of the vibration signal taken into consideration to determine a modelled value $M_{n+1}$ of the following sample $E_{n+1}$ comprises a fixed number of samples, the fixed number of samples being between 10 and 20.

For example, the modelled value of the following sample $E_{n+1}$ is obtained based on the 15 previously acquired samples.

According to one embodiment, the set $S_n$ of successive samples $E_1, \ldots, E_n$ of the vibration signal taken into consideration to determine a modelled value $M_{n+1}$ of the following sample $E_{n+1}$ may comprise a variable number of samples of between 4 and 20. In other words, the number of successive samples taken into consideration to determine a modelled value $M_{n+1}$ of the following sample $E_{n+1}$ may vary over time.

According to one embodiment, the method comprises the following step:
if an abnormal event is detected in the insulator 5 of the electrical conductor 1, incrementing an abnormal event counter.

The abnormal event counter here is a partial discharge counter.

The method comprises the following step:
if the abnormal event counter reaches a predetermined third threshold $N_{max}$, emitting an alert signal.

According to one embodiment, the predetermined third threshold Nmax for the number of acceptable abnormal events is equal to 1. In other words, in this case, no abnormal event is tolerated, and users of the device are warned when an abnormal event occurs for the first time.

As a variant, the predetermined third threshold $N_{max}$ for the number of acceptable abnormal events is between 2 and 5. This value makes it possible to confirm the presence of a fault before emitting an alert signal, without risking excessively severe damage to the device.

According to another embodiment, the method comprises the following step:
if an abnormal event is detected in the insulator 5 of the electrical conductor 1, calculating a frequency of occurrence of the abnormal event, the frequency of occurrence of the abnormal event being equal to the ratio of the value of the abnormal event counter and the number of acquired samples.

The frequency of occurrence of the abnormal event may thus be a partial discharge frequency. In other words, the frequency of occurrence of the abnormal event is in this case a rate of occurrence of a partial discharge in the electrical conductor 1.

According to one aspect of the method, the method comprises the following step:
if the frequency of occurrence of the abnormal event reaches a predetermined second threshold Fmax, emitting an alert signal.

According to one exemplary implementation, the alert signal is a fault code that is stored in an electronic control unit.

According to one variant or in addition, the alert signal is the activation of an indicator light. The alert signal may also be a text message displayed on a control screen.

According to another variant or in addition, the alert signal is an acoustic signal.

The user of the electrical device 2 is thus able to take the appropriate corrective measures in order to minimize the risks of damage to the hardware and the risks caused to people who may be close to the electrical device.

According to one embodiment, if the abnormal event counter reaches the predetermined third threshold or if the frequency of occurrence of the abnormal event reaches the predetermined second threshold, a method for classifying the abnormal event is initiated. The purpose of this method is to identify the class of the detected abnormal event, that is to say the type of abnormal event. This method will not be described here.

The invention claimed is:

1. A method for detecting an abnormal event in an insulator of an electrical conductor of a medium-voltage or high-voltage electrical device, the method comprising:
   acquiring a set of successive samples of a vibration signal associated with the electrical conductor,
   determining a modelled value of a following sample based on the acquired set of successive samples and on a prediction model, the prediction model being obtained through machine learning of the vibration signal based on a set of samples acquired in reference conditions in which the electrical conductor is free from any abnormal event, acquiring the following sample of the vibration signal, calculating a difference between a value of the acquired following sample and the modelled value, if the calculated difference is greater than a predetermined threshold, detecting an abnormal event in the electrical conductor.

2. The method according to claim 1, comprising:

if the calculated difference is less than or equal to the predetermined threshold, detecting the absence of any abnormal event in the electrical conductor.

3. The method according to claim 1, wherein the detected abnormal event is a partial discharge.

4. The method according to claim 3, wherein the reference conditions in which the machine learning is performed are an operating period starting when the electrical device is first commissioned and of a duration equal to a predetermined first duration of use of the electrical device.

5. The method according to claim 3, wherein the reference conditions in which the machine learning is performed are an operating period starting when the electrical conductor is first commissioned and of a duration equal to a predetermined second duration of use of the electrical device.

6. The method according to claim 1, wherein the set of successive samples of the vibration signal taken into consideration to determine a modelled value of the following sample comprises a fixed number of samples, the fixed number of samples being between 10 and 20.

7. The method according to claim 1, comprising:

if an abnormal event is detected in the insulator of the electrical conductor, incrementing an abnormal event counter.

8. The method according to claim 7, comprising:

if an abnormal event is detected in the insulator of the electrical conductor, calculating a frequency of occurrence of the abnormal event, the frequency of occurrence of the abnormal event being equal to a ratio of a value of the abnormal event counter and a number of acquired samples.

9. The method according to claim 8, comprising:

if the frequency of occurrence of the abnormal event reaches a predetermined second threshold, emitting an alert signal.

10. A medium-voltage or high-voltage electrical device, the electrical device comprising:

an electrical conductor, a sensor configured to supply a vibration signal associated with an insulator of the electrical conductor, an electronic control unit configured to implement the detection method according to claim 1.

11. The electrical device according to claim 10, wherein the sensor is configured to supply a signal representative of an acceleration of the insulator of the electrical conductor.

* * * * *